United States Patent [19]

Munch et al.

[11] Patent Number: 5,784,241
[45] Date of Patent: Jul. 21, 1998

[54] ELECTROMAGNETIC-NOISE PROTECTION CIRCUIT

[75] Inventors: Gaute Munch, Granslev; Jimmi Hansen, Hadsten, both of Denmark

[73] Assignee: Carlos Gavazzi AG, Steinhausen, Switzerland

[21] Appl. No.: 705,242

[22] Filed: Aug. 30, 1996

[30] Foreign Application Priority Data

Feb. 23, 1996 [EP] European Pat. Off. ............. 96102755

[51] Int. Cl.$^6$ .................................................. H02H 3/22
[52] U.S. Cl. ........................... 361/111; 361/86; 333/194; 364/572; 364/574
[58] Field of Search ..................... 361/86, 111, 113, 361/117–118; 364/572, 574; 307/129, 130; 333/12, 194

[56] References Cited

U.S. PATENT DOCUMENTS

| | | | |
|---|---|---|---|
| 3,835,412 | 9/1974 | Honda et al. | 330/298 |
| 3,983,552 | 9/1976 | Bakeman, Jr. et al. | 340/572 |
| 4,718,028 | 1/1988 | Gussin et al. | 364/572 |
| 5,386,393 | 1/1995 | Hallee et al. | 364/574 |
| 5,546,332 | 8/1996 | Strobach | 364/572 |

FOREIGN PATENT DOCUMENTS

| | | |
|---|---|---|
| 0 545 609 | 8/1985 | Australia . |
| 0 405 541 A2 | 1/1991 | European Pat. Off. . |
| 0 497 478 A2 | 1/1992 | European Pat. Off. . |
| 0 571 079 A1 | 11/1993 | European Pat. Off. . |

Primary Examiner—Jeffrey A. Gaffin
Assistant Examiner—Michael J. Sherry
Attorney, Agent, or Firm—Wells, St. John, Roberts, Gregory & Matkin, P.S.

[57] ABSTRACT

An electromagnetic-noise protection circuit for protecting an electrical device, which processes wanted signals, comprises a sensor which senses the presence of ambient electromagnetic noise from which the electrical device is to be protected, and a filter coupled to the sensor and intermitting the operation of the electrical device in time periods during which the sensor senses the presence of the ambient electromagnetic noise. The sensor can include a discriminator which discriminates wanted signals affected by ambient electromagnetic noise from wanted signals not affected by ambient electromagnetic noise. The discriminator can be implemented as a window comparator comprising at least three triggers and a logical gate and producing a logic output signal indicating if the input signal is either below a certain lower threshold or beyond a certain upper threshold.

29 Claims, 4 Drawing Sheets

5,784,241

ELECTROMAGNETIC-NOISE PROTECTION CIRCUIT

BACKGROUND OF THE INVENTION

1. Field of the Invention

The present invention generally relates to the field of electrical devices implemented by control or measurement modules such as amplifiers, motor controls, relay controls, digital panel meters, (capacitive, inductive, optical, ultrasonic, etc.) sensors and transducers, multifunction timers. In particular, the present invention relates to an electromagnetic-noise protection circuit for protecting such an electrical device, which processes wanted signals.

2. Description of Related Art

Electrical devices of all kind are commonly very sensitive to interferences by ambient electromagnetic noise which might appear in the form of for example dielectric changes or ESO (electro static discharge). An ESD transient appears when large static charges are induced on the outside of the housing of conventional electrical devices for example by plastic granulates passing and/or rubbing sensitive areas of the electrical devices. The resulting ESD transient often destroys the sensitive input or output signals of such electrical devices.

In particular, the electromagnetic-noise type of so-called fast transients or burst transients has often raised problems with electrical devices. Fast transients or burst transients are generated on alternating current (AC) or direct current (DC) communication, control, input/output, and supply lines when inductive loads such as motors or relays are declutched. The latter results in contact bounce leading to a series of very fast single pulses repeated a great number of times with varied amplitude. In industrial environments the frequency of these fast transients or burst transients can be quite high. For control and measurement modules installed in such industrial environments, these burst transients are very probable to capacitively couple to communication, control, input/output, and supply lines. The undesired result of this coupling is that ambient electromagnetic noise of high frequency is imposed to the electrical devices causing them to fail if their immunity is not sufficient.

Definition of immunity requirements and verification tests to be performed to comply with the EMC (=electromagnetic compatibility) directive is for instance given in the generic immunity standard for industrial environments EN50082-2 and in the basic standard IEC 1000-4-4.

The conventional way of reducing the effect of such ambient electromagnetic noise of high frequency (HF) is HF-filtering of all communication, control, input/output, and supply lines. However, in many cases it is very difficult to provide an effective HF-filtering of all communication, control, input/output, and supply lines. For instance a sensor cannot be isolated from the outside world by providing a grounded steel cabinet because the quantity to be detected or measured by the sensor resides outside the sensor.

Another conventional way of reducing the effect of such ambient electromagnetic noise of high frequency (HF) is shielding sensitive parts of the electrical device, for example of the printed circuit board (PCB). However, shielding for instance with copper foil is expensive and often causes less immunity of the electrical device with regard to one type of ambient electromagnetic noise when it helps with regard to another type of ambient electromagnetic noise.

All in all, the prior art way of shielding electrical devices and of filtering their output signals is difficult, does not always produce reliable and satisfactory results and is very likely to be at the expense of response time. Furthermore, the conventional protection means against ambient electromagnetic noise are not merely comparatively expensive, but also rather difficult to produce and operate because of their large number of components. Finally, it takes a lot of volume which is contradictory to the object of miniaturizing electrical devices a condition of which is providing small, even tiny electrical circuits to be implemented in those devices.

These major shortcomings in combination with electrical devices have not been remedied by conventional protection means against ambient electromagnetic noise. In general, the exactness and reliability of electrical devices according to the prior art have left much to be desired.

SUMMARY OF THE INVENTION

In consideration of the problems described above, it is an object of the present invention to provide an electromagnetic-noise protection circuit for protecting an electrical device the electromagnetic-noise protection circuit being different from the prior art so as to always guarantee the producing of exact and reliable results and thus to prevent the electrical device from failing. This object implies that the present invention provides an electromagnetic-noise protection circuit for protecting an electrical device capable of quickly responding under normal as well as disturbed operating conditions. Furthermore, the present invention aims at providing an electromagnetic-noise protection circuit being not merely comparatively cheap, but also rather easily producible and efficiently operable because of a limited number of components. Finally, the present invention is designed to provide an electromagneticnoise protection circuit taking not much volume which is in accordance with the object of miniaturizing electrical devices a condition of which is providing small, even tiny electrical circuits to be implemented in those devices.

These objects are achieved in that the electromagnetic-noise protection circuit comprises sensing means for sensing the presence of ambient electromagnetic noise from which the electrical device is to be protected, and filtering means coupled to the sensing means and intermitting the operation of the electrical device in time periods during which the sensing means senses the presence of the ambient electromagnetic noise.

In a preferred embodiment of the present invention, the sensing means includes discriminating means for discriminating wanted signals affected by ambient electromagnetic noise from wanted signals not affected by ambient electromagnetic noise.

According to a particularly advantageous embodiment of the present invention, the discriminating means is preferably a window comparator producing a logic output signal indicating if the input signal is either below a certain lower threshold $V_{wc\_low}$ or beyond a certain upper threshold $V_{wc\_up}$. The window comparator is preferably implemented by an integrated component, or by an operational amplifier with appropriate external components, or by a block comprising discrete transistors.

According to a particularly advantageous embodiment of the present invention, the window comparator comprises at least three trigger means and a logical gate means. The three trigger means can be implemented by connecting a first trigger means and a second trigger means in series and by connecting these first and second trigger means in parallel to a third trigger means. The output terminal of the second trigger means and the output terminal of the third trigger means can be coupled to the input terminals of the logical gate means.

In an advantageous embodiment of the present invention, the trigger means is implemented by a trigger producing a high output signal $V_{2,out}$ at its output terminal if the input signal $V_{2,in}$ at its input terminal is below a certain lower threshold $V_{it,low}$. If the input signal $V_{2,in}$ at the input terminal of the trigger is beyond a certain upper threshold $V_{it,up}$ the trigger produces a low output signal $V_{2,out}$ at its output terminal. Preferably, the trigger means is implemented by an inverting Schmitt-trigger, or by an operational amplifier with appropriate external components, or by a block comprising discrete transistors.

In an advantageous embodiment of the present invention, the sensing means includes at least one conductive sensing plate which is of high impedance and is capacitively coupled to external ground. The point of high impedance defined by the conductive sensing plate is preferably monitored by the discriminating means.

The conductive sensing plate can be implemented by a metal area arranged on a printed circuit board and acting as an antenna.

In a preferred embodiment of the present invention, a reference potential point for the input terminal of the discriminating means is coupled to a tap point of voltage dividing means.

The electrical device is preferably implemented by a control or measurement module such as an amplifier, a motor control, a relay control, a digital panel meter, a sensor, a multifunction timer, a transducer.

In a particularly advantageous embodiment of the present invention, the electrical device further comprises oscillator means for measuring capacitive changes. The oscillator means preferably comprises a unity gain buffer for buffering the voltage over the sensing means without imposing any load on the latter, the output terminal of the unity gain buffer being coupled to the input terminal of charging means for charging and discharging the sensing means via a resistor which is coupled to the sensing means and to the output terminal of the charging means. The sensing means is advantageously coupled to the input terminal of the unity gain buffer.

In an advantageous embodiment of the present invention, the charging means is implemented by a trigger producing a high output signal $V_{2,out}$ at its output terminal if the input signal $V_{2,in}$ at its input terminal is below a certain lower threshold $V_{it,low}$. During this first half-period of the oscillation, current flows from the output terminal of the trigger through the resistor and charges the sensing means. If the input signal $V_{2,in}$ at the input terminal of the trigger is beyond a certain upper threshold $V_{it,up}$ the trigger produces a low output signal $V_{2,out}$ at its output terminal resulting in a current flow from the sensing means via the resistor to the output terminal of the trigger. Consequently, the voltage over the sensing means decreases during this second half-period of the oscillation. Preferably, the charging means are implemented by an inverting Schmitt-trigger, or by an operational amplifier with appropriate external components, or by a block comprising discrete transistors.

In a particularly advantageous embodiment of the present invention, the electrical device comprises frequency detection means for measuring the frequency variation of a signal $f_{out}$ of the oscillator means. This frequency detection means preferably comprises a frequency divider (with a divisor n of e. g. $2^{10}=1024$), a reference oscillator, and a frequency comparator for comparing the divided frequency signal $f_{out}/n$ of the oscillator means with the frequency signal fref of the reference oscillator. Since the reference oscillator can be trimmed, the provision of an ON/OFF output which is often used in electrical devices and which is dependent on a certain externally adjustable threshold point is possible. Needless to say, that dividing the frequency fout by n has a desirable integrating effect, i. e. small erroneous variations of the period time $T_{out}=1/f_{out}$ due to ambient electromagnetic noise are levelled out.

Alternatively, the frequency detection means can also comprise a rectifier, a low-pass filter, a local oscillator, and a modulator for mixing the frequency signal $f_{out}$ of the oscillator means with the frequency signal $f_{loc}$ of the local oscillator which is for example tuned to zero-beat frequency. By mixing $f_{out}$ and $f_{loc}$, a characteristic beat frequency $f_{beat}$ is produced. The subsequent low-pass filter cuts off high frequencies beyond a certain threshold and lets pass through only the characteristic beat frequency $f_{beat}$ as it is desired.

BRIEF DESCRIPTION OF THE DRAWINGS

The present invention will be described in more detail below with reference to the exemplary embodiments which are schematically illustrated in the following drawings, in which.

DESCRIPTION OF THE PREFERRED EMBODIMENTS

Figure 1:
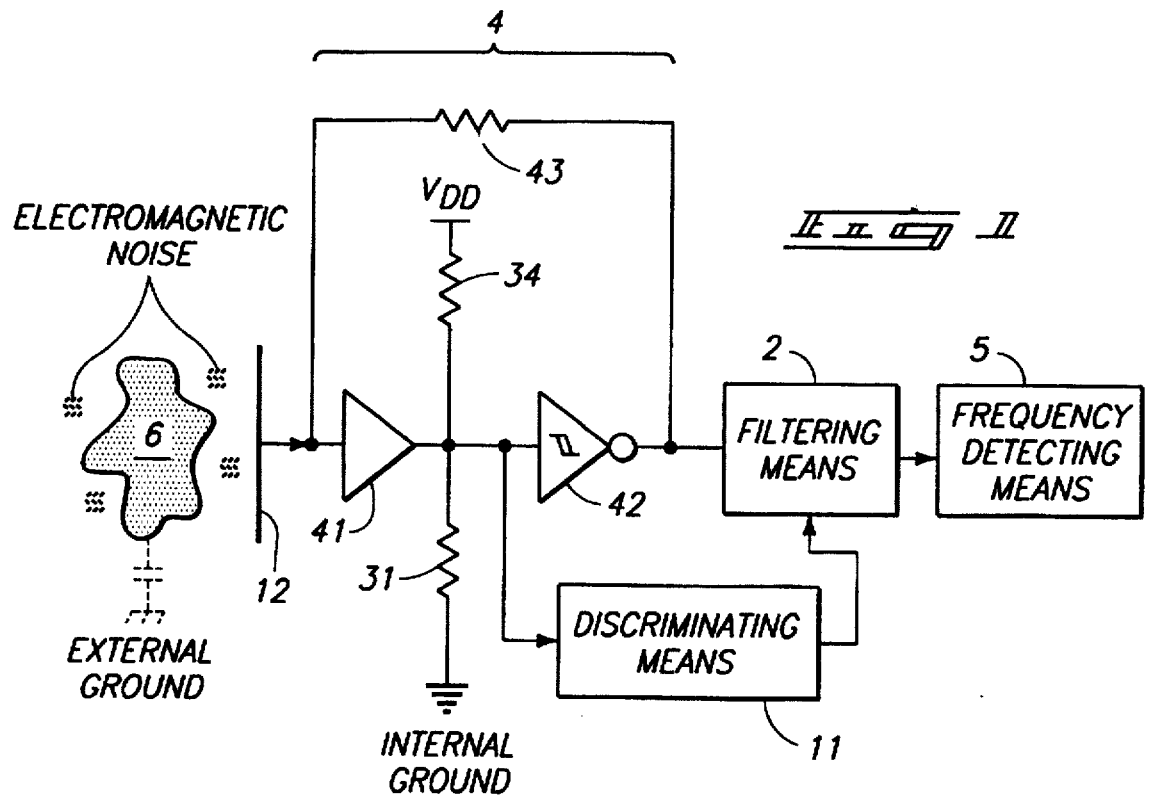
FIG. 1 is a circuit diagram showing an example of an electromagnetic-noise protection circuit for protecting an electrical device according to the invention.

An example of realizing an electromagnetic-noise protection circuit in accordance with the invention is illustrated in FIG. 1. This electromagnetic-noise protection circuit is designed for protecting an electrical device, which processes wanted signals and which can be implemented by a control or measurement module such as an amplifier, a motor control, a relay control, a digital panel meter, a sensor, a multifunction timer, a transducer.

Generally speaking, the mode of operation of the electromagnetic-noise protection circuit according to the invention is highly dependent on the type of electrical device in which it is implemented. In a micro processor controlled module (for example a PLC) a variety of response modes can be implemented. An analog/digital converter input can be protected by stalling the sampling of the analog input when a burst or spike transient due to ambient electromagnetic noise is detected. If the sampling data is stored in a file the missing samples can be registered as "noise". In a multifunction timer module, different timer functions can be chosen, for instance a delayed output triggered by an input pulse. If a burst or spike transient due to ambient electromagnetic noise appears it can easily be interpreted as an input pulse, and the timer function would be triggered. In this case, the input can be blocked while the output can be held. In a sensor component, the output status can be held while ambient electromagnetic noise is present.

In particular, the embodiment of FIG. 1 shows the use of an electromagnetic-noise protection circuit in an electrical device which is implemented in an electric control/regulator circuit for detecting how close an object 6 has approached the electrical device. The electrical device of FIG. 1 can also be used to detect whether a physical quantity of a medium the electrical device is sensitive for has reached a corresponding predetermined value. Needless to say, that the electrical device can also be used to sense capacitive changes in many other applications as for example capacitive relative humidity sensors or capacitive membrane cells for pressure measurements.

The basic principle of the electromagnetic-noise protection circuit which will be explained in more detail below is as follows:

The electromagnetic-noise protection circuit is designed for sensing the presence of ambient electromagnetic noise from which the electrical device is to be protected. The electromagnetic-noise protection circuit comprises a sensing means 11, 12 outputting a signal when the electrical device is exposed to ambient electromagnetic noise and including a discriminating means 11 which is designed for discriminating wanted signals affected by ambient electromagnetic noise from wanted signals not affected by ambient electromagnetic noise. The output signal of the sensing means 11, 12 can be used to control filtering means 2 coupled to the sensing means 11, 12 and intermitting the operation of the electrical device in time periods during which the sensing means 11, 12 senses the presence of the ambient electromagnetic noise. Consequently, the filtering means 2 is designed for removing the influence of the ambient electromagnetic noise from the output signal which is in turn transmitted to frequency detection means 5 connected in series to the filtering means 2.

In this context, it should be added that the filtering means 2 can be implemented in various ways depending on the respective electrical device for which the filtering means 2 is designed. One possible embodiment of the filtering means 2 implies to hold the status of the output signal while ambient electromagnetic noise is disturbing the sensitive signals but it can be taken for granted that alternative filter means 2 having more sophisticated functions can also be used.

The sensing means 11, 12 further includes a conductive sensing plate 12 being of high impedance, being capacitively coupled to external ground and being for example implemented by a metal area arranged on a printed circuit board and acting as an antenna. A point of high impedance defined separately for instance by appropriate voltage dividing means or by the conductive sensing plate 12 itself is monitored by the discriminating means 11, and a reference potential point for the input terminal of the discriminating means 11 is coupled to a tap point of voltage dividing means which are implemented by a first resistor 31 on ground potential and a fourth resistor 34 on positive supply potential $V_{DD}$. Since the first resistor 31 on ground potential and the fourth resistor 34 on positive supply potential $V_{DD}$ have an equal resistance value R of several $10^6$ Ohm, the reference potential point for the input terminal of the discriminating means 11 will lie at $0.5\text{-}V_{DD}$ under normal operating conditions. When the electrical device is exposed to ambient electromagnetic noise the reference potential of $0.5\text{-}V_{DD}$ will be pulled away from this potential value which will be detected by the discriminating means 11 (cf. the corresponding description of FIG. 2, 3 and 4). It should be mentioned that in the embodiment of FIG. 2 explained below the voltage dividing means are implemented by a first resistor 31 and a fourth resistor 34 (both having an equal resistance value R of $1\text{-}10^6$ Ohm to $2\text{-}10^6$ Ohm) as well as by a second resistor 32 and a third resistor 33 (both having an equal resistance value R of $1\text{-}10^4$ Ohm to $2\text{-}10^4$ Ohm) resulting in the same reference potential point of $0.5\text{-}V_{DD}$.

In FIG. 1, the electrical device further comprises oscillator means 4 for measuring capacitive changes so as to detect the presence of the object 6 placed at a variable distance in front of the conductive sensing plate 12. As the capacity of the conductive sensing plate 12 changes with the approaching object 6 or the quantity to be measured, the frequency $f_{out}$ of the output signal of the electrical device changes with it. The oscillator means 4 comprises a unity gain buffer 41 (where "unity" stands for an amplification factor of "1" of the gain buffer 41) for buffering the voltage over the conductive sensing plate 12 without imposing any load on the latter, the output terminal of the unity gain buffer 41 being coupled to the input terminal of charging means 42 for charging and discharging the conductive sensing plate 12 between some voltage levels (depending on the voltage applied to the input terminal of the charging means 42) via a resistor 43 which is coupled to the conductive sensing plate 12 and to the output terminal of the charging means 42 and which is in a range of up to $R \approx 10^7$ Ohm. It can also be taken from FIG. 1 that the conductive sensing plate 12 is coupled to the input terminal of the unity gain buffer 41.

Figure 2:
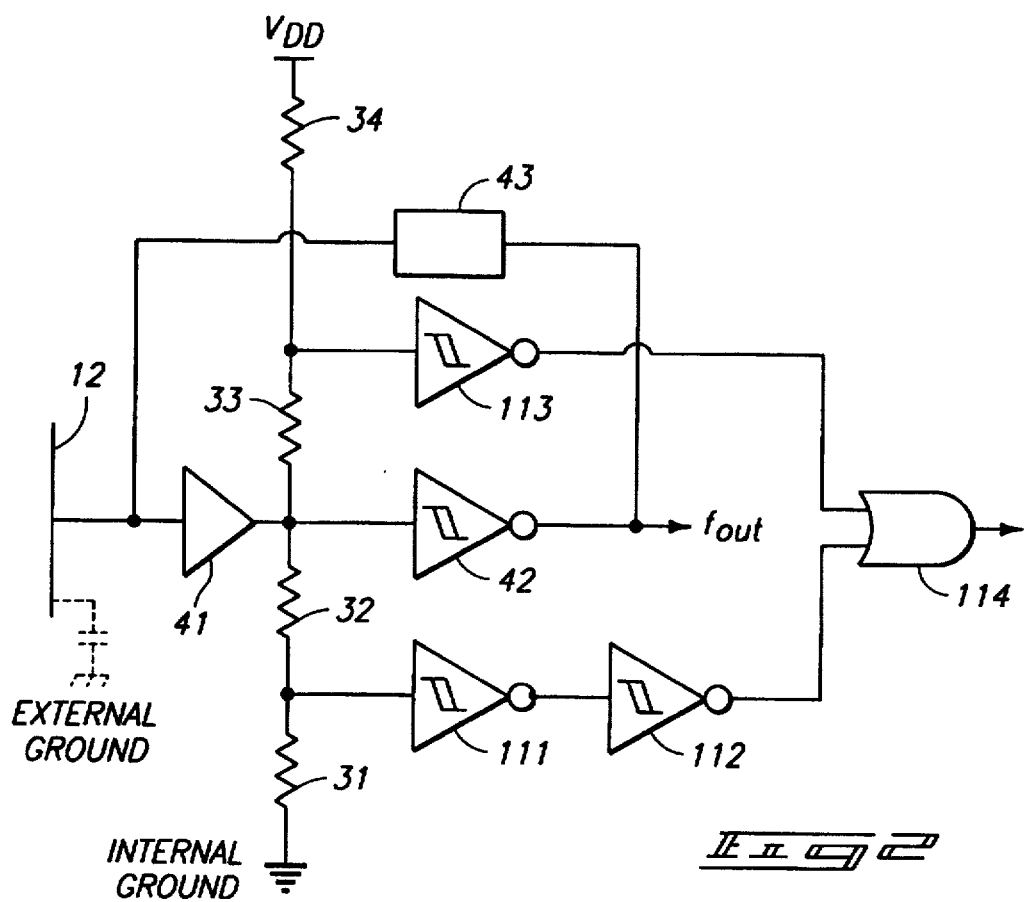
FIG. 2 is a more detailed circuit diagram showing an example of an electromagnetic-noise protection circuit for protecting an electrical device according to the invention.

In the embodiment of FIG. 2, the discriminating means 11 is implemented as a window comparator producing a logic output signal indicating if the input signal is either below a certain lower threshold $V_{wc,low}$ or beyond a certain upper threshold $V_{wc,up}$. In this context, it can be taken from FIG. 3 that the output signal of a window comparator is high when its input signal lies between a certain lower threshold $V_{wc,low}$ and a certain upper threshold $V_{wc,up}$. When the input signal of a window comparator lies below a certain lower threshold $V_{wc,low}$ or beyond a certain upper threshold $V_{wc,up}$, the output signal of the window comparator is low.

Basically, the window comparator can be implemented by an integrated component, or by an operational amplifier with appropriate external components, or by a block comprising discrete transistors. In the embodiment of FIG. 2, the window comparator comprises three trigger means 111, 112, 113 and a logical gate means 114. The three trigger means 111, 112, 113 are implemented by connecting a first trigger means 111 and a second trigger means 112 in series and by connecting these first and second trigger means 111, 112 in parallel to a third trigger means 113. The output terminal of the second trigger means 112 and the output terminal of the third trigger means 113 are coupled to the input terminals of the logical gate means 114. Since the three trigger means 111, 112, 113 as well as the charging means 42 can be taken as inverting Schmitt-triggers from the same IC (integrated circuit) package the respective trigger levels are very similar even with changing temperature.

Under normal operating conditions the output signal of the unity gain buffer 41 of the electrical device lies between a certain lower trigger level $V_{it,low}$ and a certain upper trigger level $V_{it,up}$ of the charging means 42. In other words, if no ambient electromagnetic noise is present both the output signal of the second trigger means 112 and the output signal of the third trigger means 113 are low resulting in the output signal of the logical gate means 114 in its implementation as an OR gate being also low.

When ambient electromagnetic noise such as a noise burst or noise spike the amplitude of which can be several $10^3$ Volt is imposed to the electrical device this noise is capacitively coupled to the input terminal of the window comparator via the conductive sensing plate 12 and pulls the potential from the reference potential value $0.5\text{-}V_{DD}$ to outside the threshold values $V_{wc,low}$ or $V_{wc,up}$ of the window comparator. In other words, the potential on the conductive sensing plate 12 and consequently the output signal of the unity gain buffer 41 is pulled towards either internal ground potential (e. g. 0 Volt) or positive supply potential $V_{DD}$ (e. g. 7 Volt). The window comparator having its threshold values $V_{wc,low}$ (e. g. 2.6 Volt) and $V_{wc,up}$ (e. g. 4.4 Volt) respectively outside the trigger levels $V_{it,low}$ (e. g. 2.8 Volt) and $V_{it,up}$ (e. g. 4.2 Volt) of the charging means 42 is then immediately activated signalling the detection of any noise situation.

Figure 4:
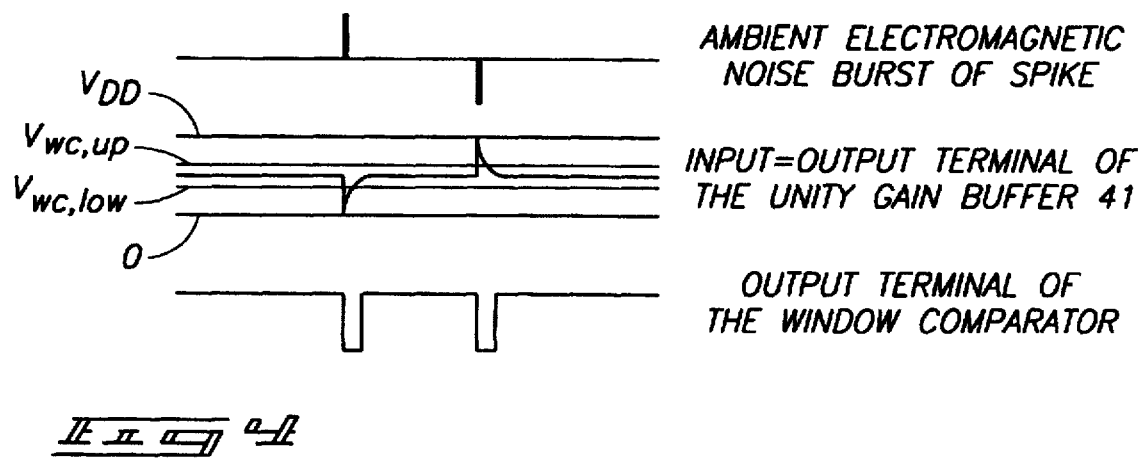
FIG. 4 is a timing diagram of ambient electromagnetic-noise detection during the operation of an electromagnetic-noise protection circuit according to the invention.

FIG. 4 shows that a positive noise burst or noise spike pulls the potential at the input terminal of the third trigger means 113 low leading to a high output signal at the output terminal of the third trigger means 113. The latter causes (independently of the status of the second trigger means 112) a high output signal at the output terminal of the logical gate means 114 in its implementation as an OR gate. Thus a positive noise burst or noise spike is detected. In other words, the positive noise burst or noise spike transient leads to an abrupt increasing shift of the internal potentials ground and $V_{DD}$ relative to the external ground potential. This results in the potential at the output terminal of the unity gain buffer 41 being pulled to internal ground.

A negative noise burst or noise spike pulls the potential at the input terminal of the first trigger means 111 high. The latter leads to a low output signal at the output terminal of the first trigger means 111 and at the input terminal of the second trigger means 112 thus leading to a high output signal at the output terminal of the second trigger means 112. The latter causes (independently of the status of the third trigger means 113) a high output signal at the output terminal of the logical gate means 114 in its implementation as an OR gate. Thus a negative noise burst or noise spike is detected. In other words, the negative noise burst or noise spike transient leads to an abrupt diminishing shift of the internal potentials ground and $V_{DD}$ relative to the external ground potential. This results in the potential at the output terminal of the unity gain buffer 41 being pulled to $V_{DD}$.

When the positive or negative noise transient dies out the capacitance of the conductive sensing plate 12 is then charged or discharged until the potential on the conductive sensing plate 12 again meets the trigger levels $V_{it,low}$ and $V_{it,up}$ of the charging means 42 resulting in a stabilized frequency output signal $f_{out}$. In the present embodiment of the electrical device based on the above-mentioned oscillator principle, this frequency output signal $f_{out}$ is converted to a direct current output value (frequency-voltage conversion). The lower the frequency $f_{out}$ of the output signal is the higher the direct current output value is. In other words, the more the electrical device is activated the higher the direct current output value is. Eventually this direct current output value reaches a trigger level and the output status changes from OFF to ON.

Figure 3:
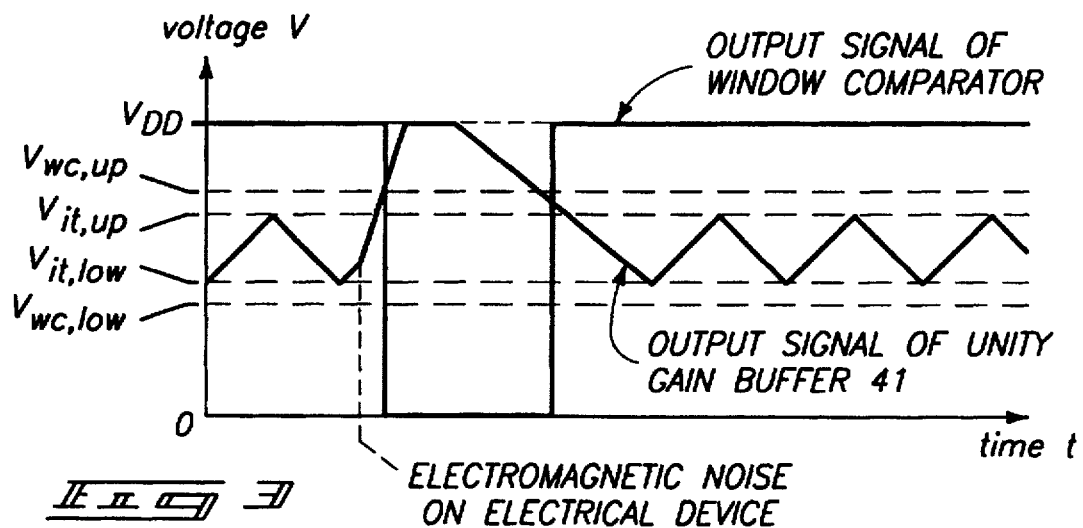
FIG. 3 is a diagram of voltage curves during the operation of an electromagneticnoise protection circuit according to the invention.

It can also be taken from FIG. 3 in combination with FIG. 4 that the frequency $f_{out}$ of the output signal falls as a result of noise disturbance, i. e. the period duration $T_{out}=1/f_{out}$ is increased due to the additional voltage amplitude of the output signal of the unity gain buffer 41. This might act as false activation of the electrical device. If the electrical device has already been in a correctly activated state before ambient electromagnetic noise is imposed on it the consequence would be further activation. In order to remove the impact of ambient electromagnetic noise the resulting output signal of the frequency-voltage conversion is pulled towards ground when ambient electromagnetic noise is detected by the window comparator but only when the electrical device is not activated.

In this context, it should not be forgotten that if the coupling to the input terminal of the window comparator via the conductive sensing plate 12 is not high enough to establish a reliable capacitive connection, the conductive sensing plate 12 can be implemented by a metal area arranged on a printed circuit board and acting as an antenna.

Figure 5:
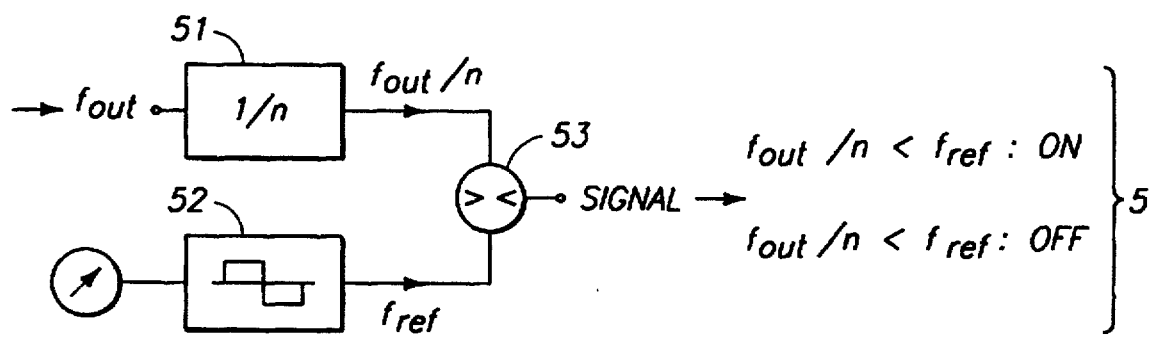
FIG. 5 is a schematic view of an embodiment of the frequency detection means implemented in an electrical device.
Figure 6:
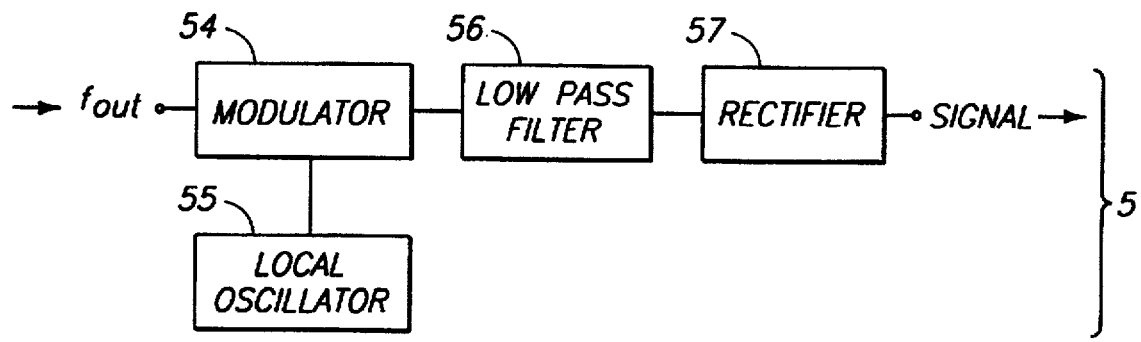
FIG. 6 is a schematic view of another embodiment of the frequency detection means implemented in an electrical device.

FIG. 5 and 6 show two schematic views of the frequency detection means 5 arranged in series to the sensing means 11, 12 and to the oscillator means 4. Generally, measuring the frequency of an alternating voltage is realized by comparing it with an exactly defined and calculable mechanical or electric resonance phenomenon. The most exact results for such frequency measurements can be obtained by beat-frequency meters which compare the frequency to be measured with a frequency standard. The latter can be defined by an atomic reference oscillator, by a quartz, crystal or piezoelectric reference oscillator, or by a synthesizer. At the best, this frequency standard is chosen in such way that the resulting difference frequency or beat frequency vanishes which can be indicated by a headset or by an instrument.

The frequency detection means 5 shown in FIG. 5 and designated for measuring the frequency variation of a signal $f_{out}$ of the oscillator means 4 comprises a frequency divider 51, a reference oscillator 52, and a frequency comparator 53 for comparing the divided frequency signal $f_{out}/n$ of the oscillator means 4 with the frequency signal $f_{ref}$ of the reference oscillator 52. Since the reference oscillator 52 can be trimmed, the provision of an ON/OFF output which is often used in electrical devices and which is dependent on a certain externally adjustable threshold point is possible. In the example of FIG. 5, the output is ON in the case that the divided frequency signal $f_{out}/n$ of the oscillator means 4 is smaller than the frequency signal $f_{ref}$ of the reference oscillator 52. For the divided frequency signal $f_{out}/n$ of the oscillator means 4 being greater than the frequency signal $f_{ref}$ of the reference oscillator 52, the output is OFF. Needless to say, that the frequency division of $f_{out}$ by n has a desirable integrating effect, i. e. small erroneous variations of the single period time $T_{out}=1/f_{out}$ due to an ESD transient are levelled out.

The frequency detection means 5 shown in FIG. 6 and also designated for measuring the frequency variation of a signal $f_{out}$ of the oscillator means 5 comprises a rectifier 57, a low-pass filter 56, a local oscillator 55, and a modulator 54. In the modulator 54, the frequency signal $f_{out}$ is mixed and thus compared with the frequency standard $f_{loc}$ produced by the local oscillator 55. The subsequent low-pass filter 56 cuts off the high frequencies beyond a certain threshold and lets pass through only the difference frequency $f_{diff}$ or the beat frequency $f_{beat}$. After having passed the rectifier 57 the resulting signal is sent to a display instrument not shown in FIG. 6.

Figure 7:
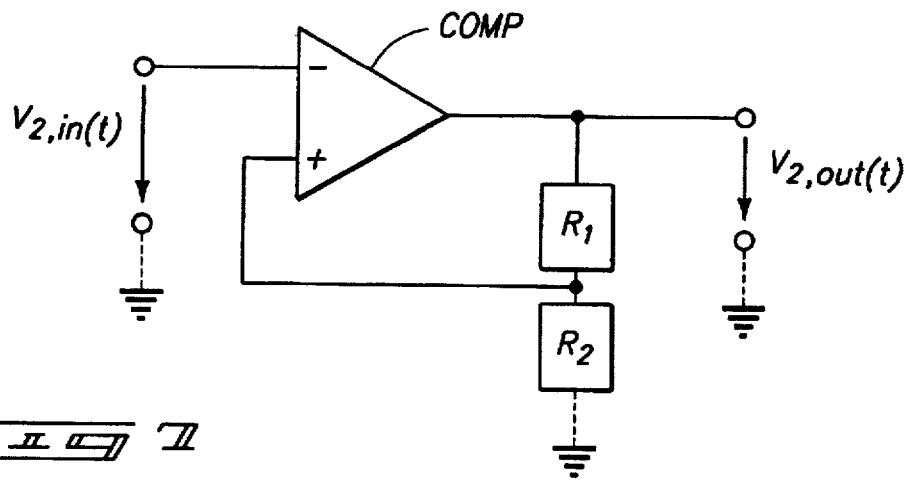
FIG. 7 is a circuit diagram of the trigger means and/or of the charging means, here realized as an inverting Schmitt-trigger.

FIG. 7 is a circuit diagram of the trigger means 111, 112, 113 and/or of the charging means 42, here realized as an inverting Schmitt-trigger which will be explained hereinbelow for the case of the charging means 42. As it is illustrated by the diagram of its voltage curve in FIG. 8, this inverting Schmitt-trigger produces a high output signal $V_{2,out}$ at its output terminal if the input signal $V_{2,in}$ at its input terminal is below a certain lower threshold $V_{it,low}$. During this first half-period of an oscillation, current flows from the output terminal of the inverting Schmitt-trigger through the resistor 43 and charges the sensing means 11, 12. If the input signal $V_{2,in}$ at the input terminal of the inverting Schmitt-trigger is beyond a certain upper threshold $V_{it,up}$ the inverting Schmitt-trigger produces a low output signal $V_{2,out}$ at its output terminal resulting in a current flow from the capacitance sensing means 11, 12 via the resistor 43 to the output terminal of the inverting Schmitttrigger. Consequently, the voltage over the sensing means 11, 12 decreases during this second half-period of the oscillation. This cycle repeats itself at the frequency $f_{out} \approx 1/(C \cdot R)$ where C is the capacity of the sensing means 11, 12 and R is the resistance of the resistor 43.

The inverting Schmitt-trigger of FIG. 7 comprises a comparator COMP as well as a voltage divider consisting of a first resistor (resistance $R_1$) and of a second resistor (resistance $R_2$). Such a Schmitt-trigger offers as a special feature that its turn-on-level $V_{it,low} = V_2^{min} \cdot R_2/(R_1+R_2)$ does not coincide with its turn-off-level $V_{it,up} = V_2^{max} \cdot R_2/(R_1+R_2)$ but the two differ by a switching backlash $\Delta V_{sb} = (V_{2,out}^{max} - V_{2,out}^{min}) \cdot R_2/(R_1+R_2)$ (for an illustration of $V_{it,low}$ and $V_{it,up}$ as well as of $V_{2,out}^{min}$ and $V_{2,out}^{max}$ confer to the diagram of the voltage curve of the inverting Schmitt-trigger in FIG. 8 as well as to the transfer characteristic of the inverting Schmitt-trigger in FIG. 9). In the inverting Schmitt-trigger such as shown in FIG. 7, this switching backlash $\Delta V_{sb}$ is produced by a so-called regenerative feedback of the comparator COMP via the voltage divider. For a great negative voltage $V_{2,in}$ at the input terminal of the inverting Schmitt-trigger, $V_{2,out}$ at its output terminal reaches the maximum value $V_{2,out}^{max}$. In this case, the maximum potential $V_{it,up}$ at the P-input terminal of the comparator COMP of the inverting Schmitt-trigger is therefore given by $V_{it,up} = V_{2,out}^{max} \cdot R_2/(R_1+R_2)$. With increasing voltage $V_{2,in}(t)$ at the input terminal of the inverting Schmitt-trigger, the voltage $V_{2,out}(t)$ at its output terminal is not changed during the first half-period of the oscillation. But with the voltage $V_{2,in}(t)$ at the input terminal of the inverting Schmitt-trigger reaching the value $V_{it,up}$, the voltage $V_{2,out}(t)$ at its output terminal abruptly and rapidly decreases to the value $V_{2,out}^{min}$ because of regenerative feedback: the decrease of the voltage $V_{2,out}(t)$ at the output terminal of the inverting Schmitt-trigger implies the decrease of the voltage at the P-input terminal of the comparator COMP of the inverting Schmitt-trigger, i. e. the difference value of the voltage at the P-input terminal minus the voltage at the N-input terminal becomes negative which forms a regenerative feedback. As a result, the potential at the P-input terminal of the comparator COMP of the inverting Schmitt-trigger reaches its minimum value $V_{it,low} = V_{2,out}^{min} \cdot R_2/(R_1+R_2)$. Now, the difference value of the voltage at the P-input terminal minus the voltage at the N-input terminal becomes very negative, and the state of the inverting Schmitt-trigger is stable during this second half-period of the oscillation as long as the voltage $V_{2,in}(t)$ at the input terminal of the inverting Schmitt-trigger has not yet reached the value $V_{it,low}$. If the latter is the case, the voltage $V_{2,out}(t)$ at the output terminal of the inverting Schmitt-trigger abruptly and rapidly increases to the value $V_{2,out}^{max}$ which forms the end of the second half-period of the oscillation.

Figure 8:
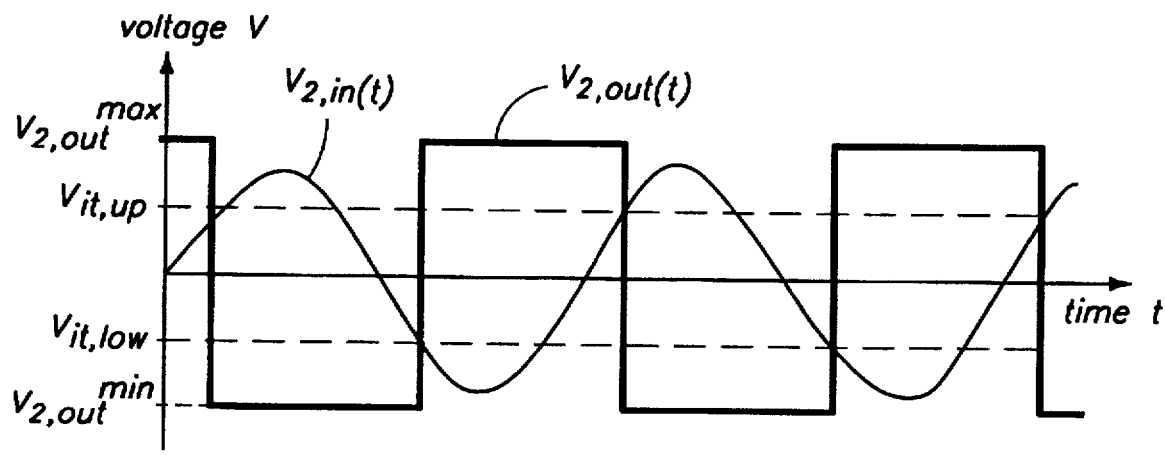
FIG. 8 is a diagram of the voltage curve of the inverting Schmitt-trigger shown in FIG. 7.
Figure 9:
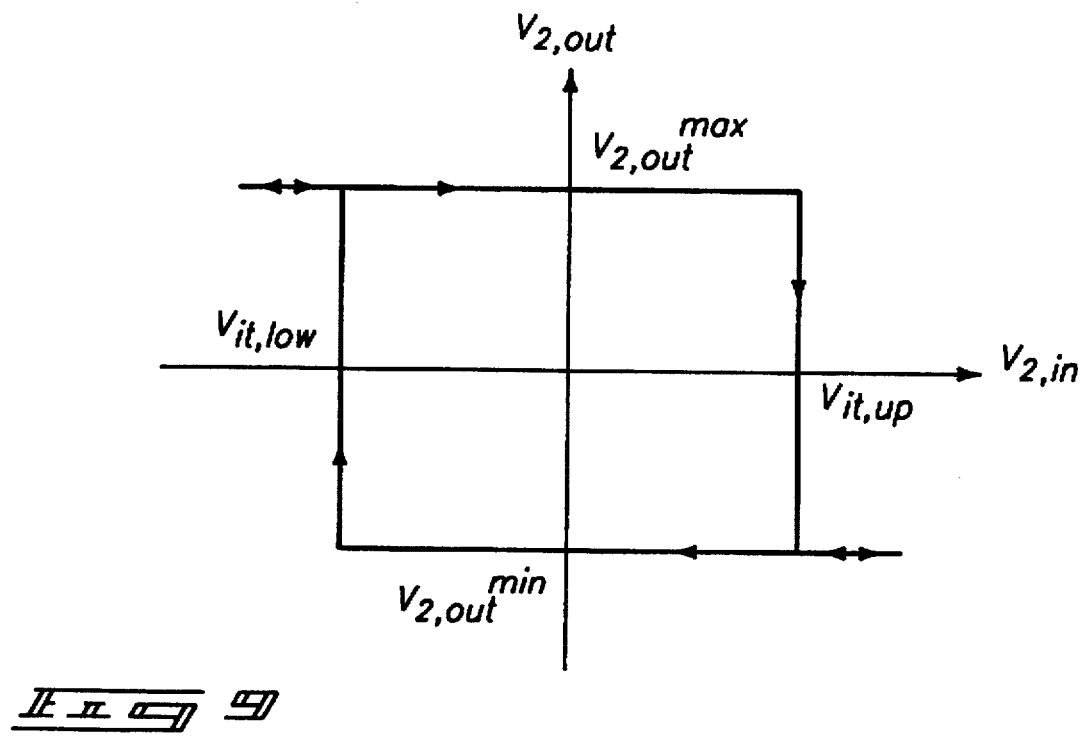
FIG. 9 is a diagram of the transfer characteristic of the inverting Schmitttrigger shown in FIG. 7.

The mode of operation of the inverting Schmitt-trigger which has been explained above is additionally illustrated by the diagram of its voltage curve in FIG. 8 as well as by its transfer characteristic in FIG. 9.

The embodiments of the present invention presented hereinbefore provide an electromagnetic-noise protection circuit always guaranteing the producing of exact and reliable results and thus preventing the electrical device from failing. Therefor the present electromagnetic-noise protection circuit for protecting an electrical device is capable of quickly responding under normal as well as disturbed operating conditions. Furthermore, the present electromagnetic-noise protection circuit is not merely comparatively cheap, but also rather easily producible and efficiently operable because of a limited number of components. Finally, the present electromagnetic-noise protection circuit takes not much volume which is in accordance with the demand for miniaturized electrical devices a condition of which is providing small, even tiny electrical circuits to be implemented in those devices.

Having thus described the principles of the invention, together with several illustrative embodiments thereof, it is to be understood that although specific terms are employed, they are used in a generic and descriptive sense, and not for purposes of limitation, the scope of the invention being set forth in the following claims.

We claim:

1. An electromagnetic-noise protection circuit for protecting an electrical device, which processes wanted signals, the electromagnetic-noise protection circuit comprising:

a sensor which senses the presence of ambient electromagnetic noise from which the electrical device is to be protected, the sensor including a high impedance point capacitively coupled to a ground external of the electrical device;

a discriminator which monitors the sensor and discriminates time periods when the sensor senses ambient electromagnetic noise from time periods when the sensor does not sense ambient electromagnetic noise; and a filter coupled to the sensor and removing the influence of ambient electromagnetic noise in time periods during which the sensor senses the presence of the ambient electromagnetic noise.

2. A circuit according to claim 1, wherein the discriminator includes a window comparator producing a logical output signal indicating whether noise is present or not.

3. A circuit according to claim 2, and further comprising a voltage divider having a tap point defining a reference potential, and wherein the discriminator has an input terminal coupled to the tap point of the voltage divider.

4. An electromagnetic-noise protection circuit for protecting an electrical device, which processes wanted signals, the electromagnetic-noise protection circuit comprising:

a sensor which senses the presence of ambient electromagnetic noise from which the electrical device is to be protected, the sensor including a discriminator which discriminates wanted signals affected by ambient electromagnetic noise from wanted signals not affected by ambient electromagnetic noise, the discriminator being a window comparator producing a logic output signal indicating if the input signal is either below a certain lower threshold Vwc,low or beyond a certain upper threshold Vwc,up; and a filter coupled to the sensor and intermitting the operation of the electrical device in time periods during which the sensor senses the presence of the ambient electromagnetic noise.

5. A circuit according to claim 4, wherein the window comparator is implemented by an integrated component, or by an operational amplifier with appropriate external components, or by a block comprising discrete transistors.

6. A circuit according to claim 4, wherein the window comparator comprises at least three triggers and a logical gate.

7. A circuit according to claim 6, wherein the three triggers are arranged by connecting a first one of the triggers and a second one of the triggers in series and by connecting these first and second triggers in parallel to a third one of the triggers.

8. A circuit according to claim 7, wherein the second trigger has an output terminal, wherein the third trigger has an output terminal, and wherein the logical gate has a first input terminal connected to the output terminal of the second trigger and has a second input terminal connected to the output terminal of the third trigger.

9. A circuit according to claim 7, wherein each trigger produces a high output signal in response to an input signal being below a certain lower threshold, and produces a low output signal in response to an input signal being above a certain upper threshold.

10. A circuit according to claim 6, wherein each trigger produces a high output signal in response to an input signal being below a certain lower threshold, and produces a low output signal in response to an input signal being above a certain upper threshold.

11. A circuit according to claim 10, wherein each trigger comprises an inverting Schmitt-trigger.

12. A circuit according to claim 11, and further comprising a voltage divider having a tap point defining a reference potential, and wherein the discriminator has an input terminal coupled to the tap point of the voltage divider.

13. An electromagnetic-noise protection circuit for protecting an electrical device, which processes wanted signals, the electromagnetic-noise protection circuit comprising:

a sensor configured to sense the presence of ambient electromagnetic noise from which the electrical device is to be protected, the sensor including at least one conductive sensing plate providing a high impedance point configured to be capacitively coupled to a ground external of the electrical device; and a filter coupled to the sensor and configured to remove the influence of ambient electromagnetic noise in time periods during which the sensor senses the presence of the ambient electromagnetic noise.

14. A circuit according to claim 13, wherein the sensor includes a discriminator which discriminates wanted signals affected by ambient electromagnetic noise from wanted signals not affected by ambient electromagnetic noise, and wherein the conductive sensing plate is monitored by the discriminator.

15. A circuit according to claim 14, wherein the conductive sensing plate is implemented by a metal area arranged on a printed circuit board and acting as an antenna.

16. A circuit according to claim 13, wherein the conductive sensing plate is implemented by a metal area arranged on a printed circuit board and acting as an antenna.

17. A circuit according to claim 13, and further comprising a voltage divider having a tap point defining a reference potential, wherein the sensor includes a discriminator which discriminates wanted signals affected by ambient electromagnetic noise from wanted signals not affected by ambient electromagnetic noise, and wherein the discriminator has an input terminal coupled to the tap point of the voltage divider.

18. An electrical system comprising:

an electrical device; and an electromagnetic-noise protection circuit configured to protect the electrical device, the electromagnetic-noise protection circuit including a sensor configured to sense the presence of ambient electromagnetic noise from which the electrical device is to be protected, the sensor including a plate configured to be capacitively coupled to an external ground, the electromagnetic-noise protection circuit further including a discriminator configured to monitor the sensor and discriminate time periods when the sensor senses ambient electromagnetic noise from time periods when the sensor does not sense ambient electromagnetic noise, the discriminator including a window comparator, and the electromagnetic-noise protection circuit including a filter coupled to the sensor to remove the influence of ambient electromagnetic noise in time periods during which the sensor senses the presence of the ambient electromagnetic noise.

19. A system according to claim 18, wherein the electrical device is selected from the group consisting of an amplifier, a motor control, a relay control, a digital panel meter, a sensor, a multifunction timer, and a transducer.

20. A system according to claim 18, wherein the electrical device further comprises an oscillator measuring capacitive changes.

21. A system according to claim 20, wherein the electrical device comprises a frequency detector measuring the frequency variation of a signal $f_{out}$ of the oscillator.

22. An electrical system comprising:

an electrical device including an oscillator measuring capacitive changes;

an electromagnetic-noise protection circuit protecting the electrical device, the electromagnetic-noise protection circuit including a sensor which senses the presence of ambient electromagnetic noise from which the electrical device is to be protected, and the electromagnetic-noise protection circuit including a filter coupled to the sensor and interrupting operation of the electrical device in time periods during which the sensor senses the presence of the ambient electromagnetic noise; and charging circuitry having an input terminal and an output terminal, and a resistor coupled to the sensor and to the output terminal of the charging circuitry, the charging circuitry charging and discharging the sensor via the resistor, the oscillator including a unity gain buffer buffering the voltage over the sensor without imposing any load on the sensor, and the unity gain buffer having an output terminal coupled to the input terminal of the charging circuitry.

23. A system according to claim 22, wherein the unity gain buffer has an input terminal, and wherein the sensor is coupled to the input terminal of the unity gain buffer.

24. A system according to claim 22, wherein the charging circuitry is implemented by a trigger producing a high output signal at its output terminal if the input signal at its input terminal is below a certain lower threshold, and producing a low output signal at its output terminal if the input signal at its input terminal is beyond a certain upper threshold.

25. A system according to claim 24, wherein the charging circuitry is implemented by an inverting Schmitt-trigger.

26. An electromagnetic-noise protection circuit for protecting an electrical device which processes wanted signals, the electromagnetic-noise protection circuit comprising:

sensing means for sensing the presence of ambient electromagnetic noise from which the electrical device is to be protected, the sensing means including discriminating means for discriminating wanted signals affected by ambient electromagnetic noise from wanted signals not affected by ambient electromagnetic noise, the discriminating means having an input and including window comparator means for producing a logic output signal in response to at least one of a signal at the input of the discriminating means falling below a predetermined lower threshold and a signal at the input of the discriminating means rising above a predetermined upper threshold, the window comparator means including at least three triggers and a logical gate; and means, coupled to the sensing means, for interrupting the operation of the electrical device in time periods during which the sensor senses the presence of the ambient electromagnetic noise.

27. A circuit according to claim 26, wherein the three triggers are arranged by connecting a first one of the triggers and a second one of the triggers in series and by connecting these first and second triggers in parallel to a third one of the triggers.

28. A circuit according to claim 27, wherein each trigger comprises an inverting Schmitt-trigger.

29. A circuit according to claim 26, and further comprising a voltage divider having a tap point defining a reference potential, and wherein the discriminating means has an input terminal coupled to the tap point of the voltage divider.

* * * * *